US009478570B2

(12) United States Patent
Manouvrier et al.

(10) Patent No.: US 9,478,570 B2
(45) Date of Patent: Oct. 25, 2016

(54) VERTICAL GATE TRANSISTOR AND PIXEL STRUCTURE COMPRISING SUCH A TRANSISTOR

(71) Applicants: STMicroelectronics SA, Montrouge (FR); STMicroelectronics (Crolles 2) SAS, Crolles (FR)

(72) Inventors: Jean-Robert Manouvrier, Echirolles (FR); Pascal Fonteneau, Theys (FR); Xavier Montagner, Meylan (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/929,077

(22) Filed: Oct. 30, 2015

(65) Prior Publication Data

US 2016/0056192 A1    Feb. 25, 2016

Related U.S. Application Data

(63) Continuation of application No. 14/660,847, filed on Mar. 17, 2015, now Pat. No. 9,209,211.

(51) Int. Cl.
*H01L 27/146* (2006.01)
*H01L 29/423* (2006.01)

(52) U.S. Cl.
CPC ..... *H01L 27/14614* (2013.01); *H01L 27/1463* (2013.01); *H01L 27/1464* (2013.01); *H01L 27/14607* (2013.01); *H01L 27/14612* (2013.01); *H01L 27/14636* (2013.01); *H01L 27/14641* (2013.01); *H01L 27/14643* (2013.01); *H01L 27/14687* (2013.01); *H01L 27/14689* (2013.01); *H01L 29/4236* (2013.01)

(58) Field of Classification Search
CPC ................... H01L 27/146; H01L 27/14614
See application file for complete search history.

(56) References Cited

U.S. PATENT DOCUMENTS

| 2009/0303371 | A1 | 12/2009 | Watanabe et al. |
| 2010/0193845 | A1 | 8/2010 | Roy et al. |
| 2011/0096208 | A1 | 4/2011 | Roy et al. |
| 2012/0199882 | A1 | 8/2012 | Shin |
| 2014/0084143 | A1* | 3/2014 | Sakano ............. H01L 27/14609 250/208.1 |
| 2014/0145068 | A1* | 5/2014 | Meynants ......... H01L 27/14605 250/208.1 |

* cited by examiner

*Primary Examiner* — Marc Armand
(74) *Attorney, Agent, or Firm* — Seed IP Law Group PLLC

(57) ABSTRACT

The present disclosure relates to a photodiode comprising: a P-conductivity type substrate region, an electric charge collecting region for collecting electric charges appearing when a rear face of the substrate region receives light, the collecting region comprising an N-conductivity type region formed deep in the substrate region, an N-conductivity type read region formed in the substrate region, and an isolated transfer gate, formed in the substrate region in a deep isolating trench extending opposite a lateral face of the N-conductivity type region, next to the read region, and arranged for receiving a gate voltage to transfer electric charges stored in the collecting region toward the read region.

15 Claims, 12 Drawing Sheets

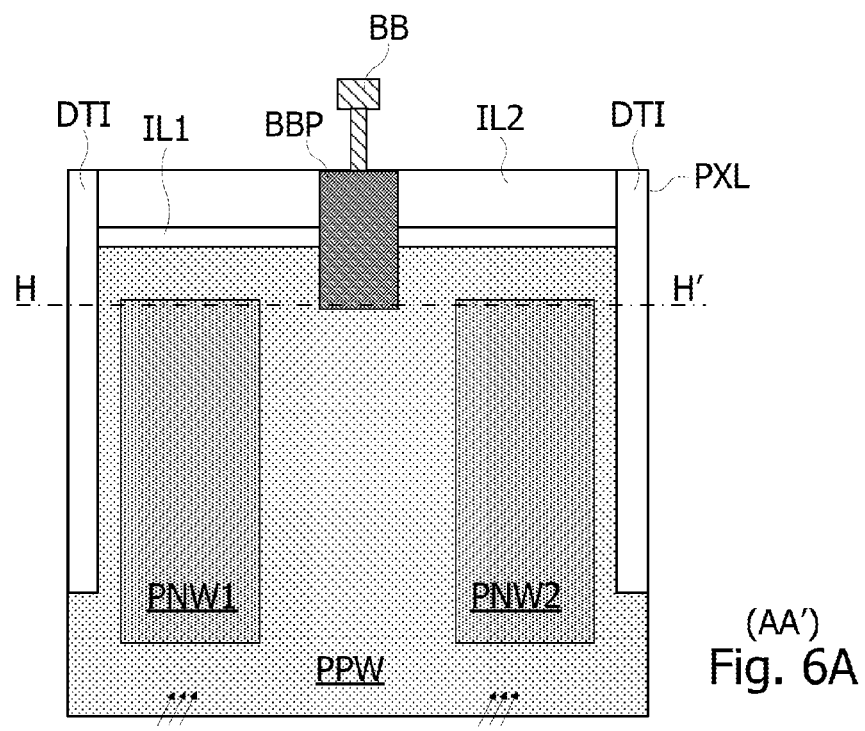
Fig. 6A (AA')
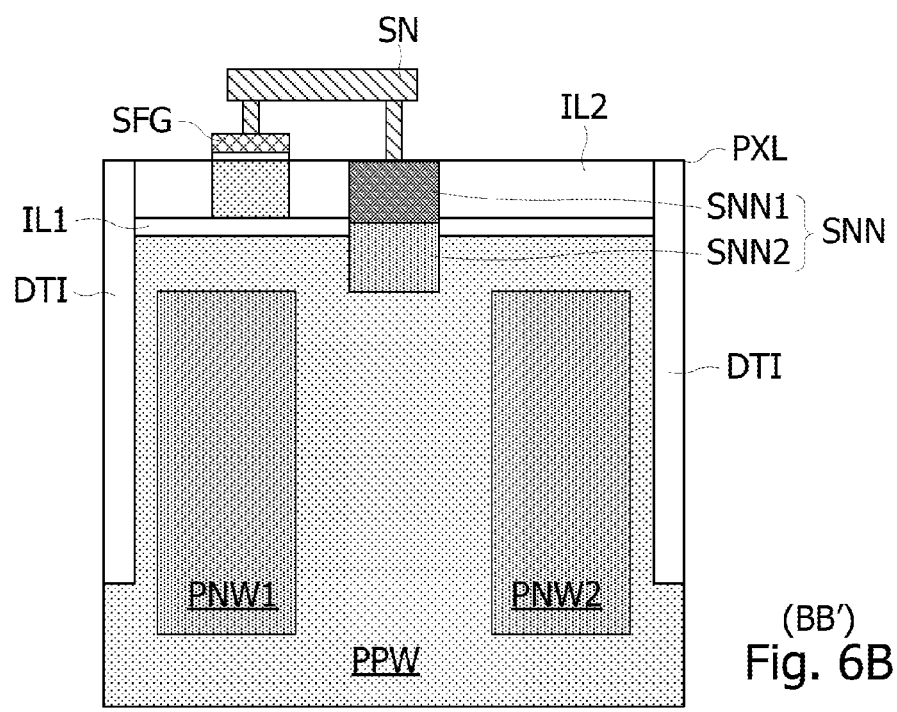
Fig. 6B (BB')

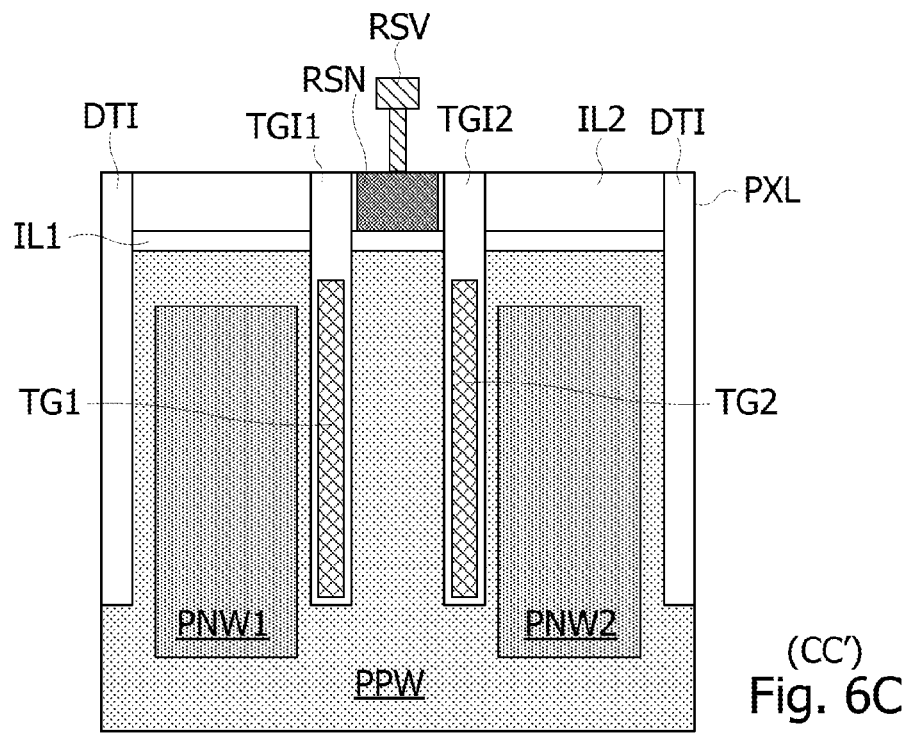
Fig. 6C (CC')
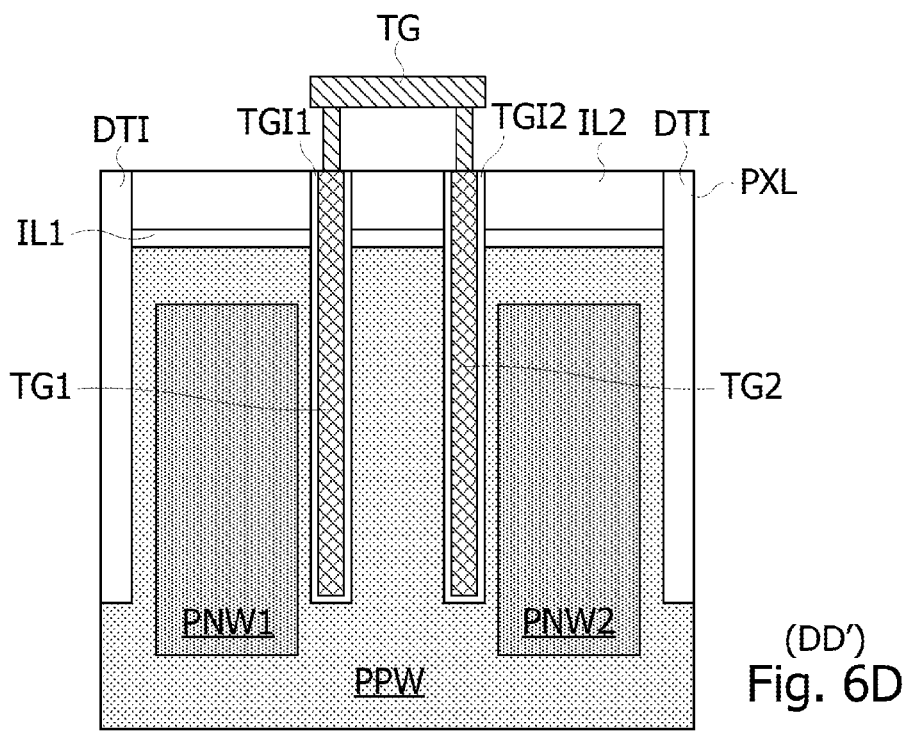
Fig. 6D (DD')

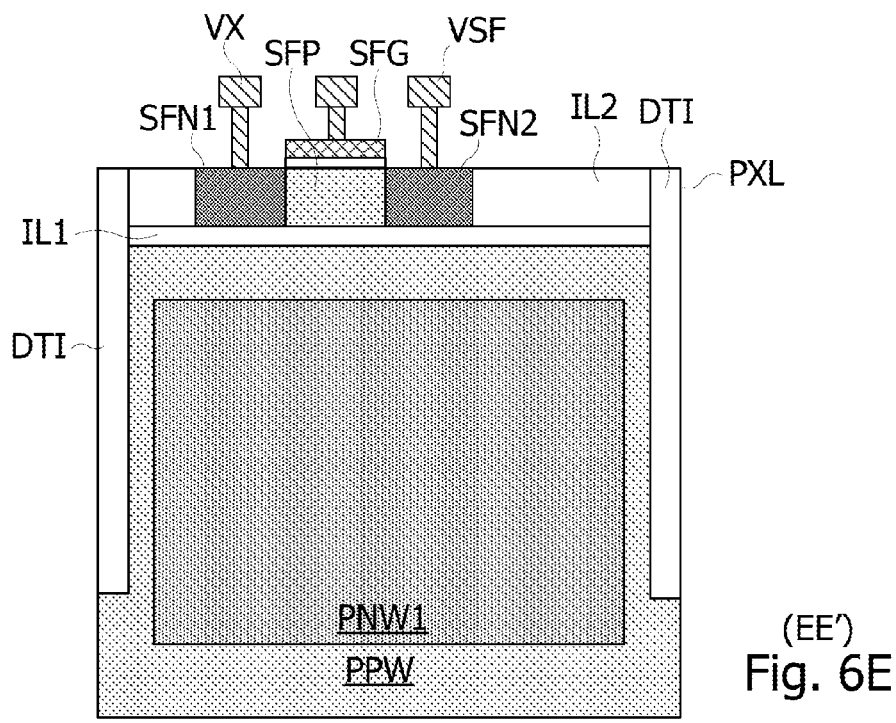
Fig. 6E (EE')
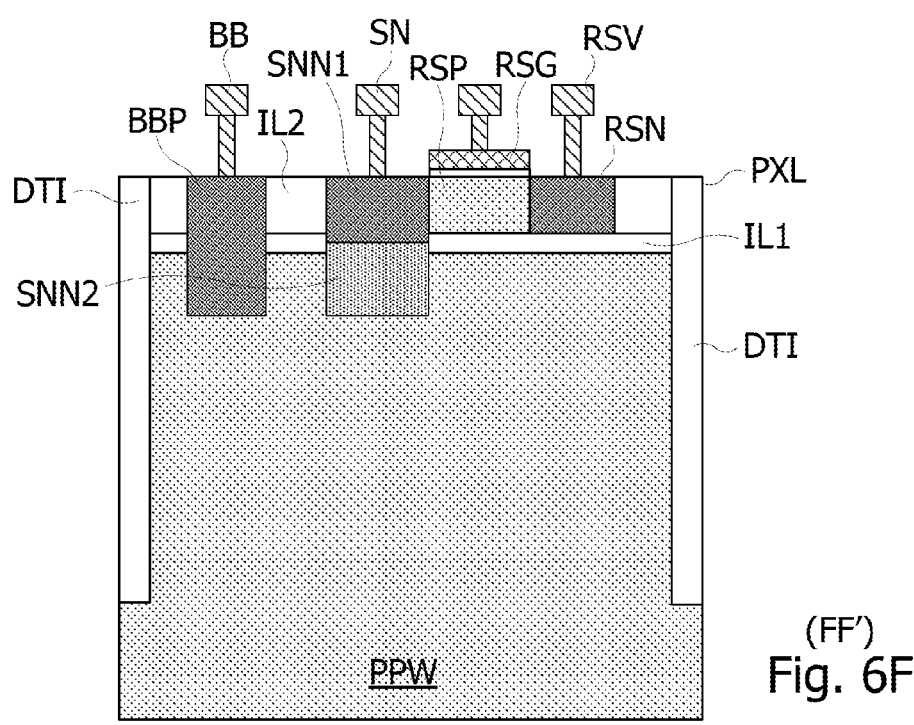
Fig. 6F (FF')

VERTICAL GATE TRANSISTOR AND PIXEL STRUCTURE COMPRISING SUCH A TRANSISTOR

BACKGROUND

1. Technical Field

The present disclosure relates to sensors, in particular CMOS technology sensors, and more particularly to a structure of light-sensitive pixel of BSI type (Back-Side Illumination).

2. Description of the Related Art

Such image sensors comprise a network of pixels formed in a semiconductor substrate. Each pixel comprises a photodiode coupled to a read node by a transfer transistor. The electric charges accumulated by the photodiode during an integration time can be transferred to a read node by the transfer transistor. The voltage of the charges accumulated at the read node is read by a read circuit generally comprising a source follower transistor, the gate of which is coupled to the read node. The read circuit also comprises a reset transistor, also coupled to the read node, to reset to zero the voltage at the read node after each read. To reduce the number of components, one well-known method involves sharing the read circuit between several photodiodes.

The sensitivity and thus the quality of the image sensor are in particular related to the capacity of each photodiode to store electric charges. In particular, if during the integration time, several photodiodes can no longer store electric charges, and thus reach a saturation state, the quality of the image supplied by the image sensor will be affected.

To reduce the size of pixels and increase their sensitivity, one well-known method also involves forming the photodiodes in the thickness of the substrate so as to be capable of capturing the light via the rear face of the substrate (BSI technology), whereas the transfer transistors, the read circuits and the electrical links between the pixels and a circuit for managing the image sensor are formed on the front face of the substrate. In this way, the entire rear face of the substrate can be used to capture the light.

FIGS. 1 and 2 are cross-sections and top views representing a pair of pixels 1, 2 of a BSI-type image sensor. FIG. 3 schematically represents a circuit formed by the pair of pixels in FIGS. 1 and 2. The pixels 1, 2 are formed in a silicon substrate 3, in which pixel regions are delimited by perpendicular deep isolating trenches 6. Each pixel comprises a photodiode PD11, PD12 formed in a slightly doped P-conductivity type region 4, 5 of the substrate 3, extending from the surface of the substrate 3 over most of the thickness of the latter. Each photodiode PD11, PD12 comprises a slightly doped N-conductivity type region 13, 23, formed in the region 4, 5. The region 13, 23 extends over most of the thickness of the region 4, 5. Charges resulting from the light reaching the region 4, 5 via the rear face of the substrate 3 accumulate in the region 13, 23. These charges are transferred during a transfer phase toward a read node 10, 20, by a transfer transistor T11, T12 comprising a gate stack 11, 21 formed on the front face of the substrate 3 above the area 13, 23. The read node 10, 20 comprises a heavily doped N-type read region 14, 24 forming a conduction region of the transfer transistor T11, T12. During the transfer phase, charges leave the region 13, 23 by the side and top, toward the read node 10, 20, passing through a channel produced by applying a transfer voltage to the terminal 12, 22 of the gate stack 11, 21 of the transfer transistor T11, T12.

To reduce the number of components per pixel, the pair of pixels 1, 2 comprises a single reset transistor T13 and a single source follower transistor T14, the read nodes 10 and 20 of the two pixels 1, 2 being interconnected by a link 7. The transistor T13 comprises a gate stack 31, a conduction region corresponding to the read region 14, shared with the transfer transistor T11 and a conduction region receiving a voltage VRS. The transistor T14 comprises a gate stack 41 connected to the read nodes 10, 20 and a conduction region receiving a supply voltage VSF. The area of the substrate 3 beneath the gate stack 41 is separated from the read region 24 of the read node 20 by a shallow trench STI. The quantity of charges accumulated by each of the photodiodes PD11, PD12 can be separately measured by means of the transistor T14, by successively controlling the two transfer transistors T11, T12, to transfer the charges accumulated by each photodiode at the read node 10, 20. Between each charge transfer, the reset transistor T13 can be controlled to reset the voltage of the read node 10, 20.

It is desirable to increase the sensitivity of the photodiodes of such a pixel structure, without increasing the surface area of substrate occupied by the pixel.

BRIEF SUMMARY

Some embodiments relate to a photodiode including a P-conductivity type substrate region, an electric charge collecting region for collecting electric charges appearing when a rear face of the substrate region receives light, the collecting region comprising an N-conductivity type region formed deep in the substrate region, an N-conductivity type read region, formed in the substrate region, and an isolated transfer gate, disposed in the substrate region next to the N-conductivity type region and to the read region, and arranged for receiving a gate voltage to transfer electric charges stored in the collecting region toward the read region. Of one embodiment, the transfer gate is formed in a deep isolating trench extending opposite a lateral face of the N-conductivity type region.

Of one embodiment, the photodiode comprises a conductive column linked to the transfer gate and passing through an isolating layer to reach a front face of a substrate comprising the substrate region and the isolating layer.

Of one embodiment, the transfer gate has a lateral surface corresponding to and disposed opposite a right or left half of a lateral face of the N-conductivity type region.

Of one embodiment, the transfer gate extends in the substrate region over a depth of 1.5 to 3.5 μm, and over a width of 0.1 to 0.3 μm.

Of one embodiment, the transfer gate is isolated from the substrate region by an isolating layer the thickness of which is between 10 and 20 nm.

Of one embodiment, the collecting region has a symmetrical structure comprising two N-conductivity type regions and two transfer gates each disposed between one of the two N-conductivity type regions and the read region, to transfer electric charges stored in the collecting region toward the read region.

Of one embodiment, the collecting region has a symmetrical structure in which the N-conductivity type region has a U-shaped section in a plane parallel to the front face of the substrate region.

Of one embodiment, the gate has a U-shaped section in a plane parallel to the front face of the substrate region and is disposed between the branches of the U shape of the N-conductivity type region and around the read region.

Some embodiments also relate to an image sensor pixel comprising the photodiode previously defined.

Of one embodiment, the read region forms a conduction region of a reset transistor provided to reset a voltage of the read region.

Of one embodiment, the pixel comprises a source follower transistor comprising a gate terminal linked to the read region, the source follower transistor being formed above the N-conductivity type region, an isolating layer being arranged between the source follower transistor and the N-conductivity type region.

Some embodiments also relate to an image sensor comprising several pixels like the one previously defined, the pixels being isolated from each other by deep isolating trenches or embedded vertical gates.

Some embodiments also relate to an electronic device comprising the image sensor previously defined.

Some embodiments also relate to a method for manufacturing an image sensor comprising the formation of pixels, the formation of each pixel comprising steps of: forming in a P-conductivity type substrate region an electric charge collecting region for collecting electric charges appearing when a rear face of the substrate region receives light, the collecting region comprising an N-conductivity type region formed in the substrate region, forming in the substrate region an N-conductivity type read region, forming in the substrate region a deep isolating trench extending opposite a lateral face of the N-conductivity type region and next to the read region, and forming an isolated transfer gate in the isolating trench, the transfer gate being arranged for receiving a gate voltage to transfer electric charges stored in the collecting region toward the read region.

Of one embodiment, the substrate is of silicon-on-insulator type.

Of one embodiment, the read region and a substrate bias region are formed by epitaxy of a semi-conductive material in a hole passing through an isolating layer of the substrate to reach the substrate region.

BRIEF DESCRIPTION OF THE SEVERAL VIEWS OF THE DRAWINGS

These and other objects, characteristics and advantages of the present disclosure will be explained in greater detail in the following description of specific embodiments given below in relation with, but not limited to, the following figures, in which:

FIGS. 6A, 6B, 6C, 6D, 6E, 6F and 6G are cross-sections of the pixel represented in FIG. 5, of planes AA', BB', CC', DD', EE', FF' and GG' indicated on FIG. 5.

DETAILED DESCRIPTION

Figure 4:
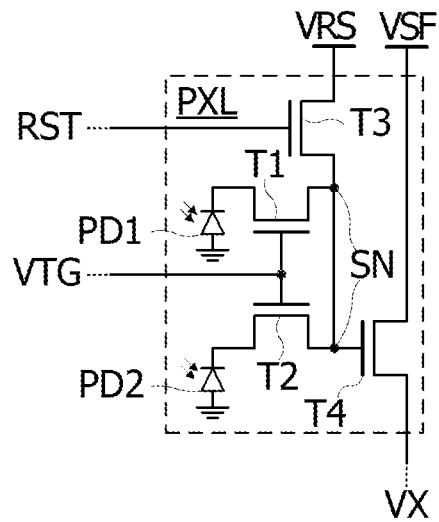

FIG. 4 represents a pixel structure of one embodiment. The pixel structure PXL comprises two photodiodes PD1, PD2, two transfer transistors T1, T2, a reset transistor T3 and a source follower transistor T4. The transistor T1 comprises a conduction terminal connected to the photodiode PD1, and a conduction terminal connected to a common read node SN. The transistor T2 comprises a conduction terminal connected to the photodiode PD2, and a conduction terminal connected to the read node SN. Each of the transistors T1, T2 comprises a control terminal receiving a same control signal VTG. The transistor T3 comprises a conduction terminal connected to the read node SN, a conduction terminal receiving a supply voltage VRS and a control terminal receiving a control signal RST. The transistor T4 comprises a control terminal connected to the read node SN, a conduction terminal receiving a supply voltage VSF and a conduction terminal subjected to a voltage VX.

FIGS. 5, 6A, 6B, 6C, 6D, 6E, 6F and 6G represent the pixel structure PXL produced in an SOI-type substrate (Silicon On Insulator), of one embodiment. The substrate comprises a substrate region PPW in a semi-conductive material, covered on a front face with a thin layer made of an isolating material IL1. The layer IL1 is covered with an isolating layer IL2 that is thicker than the layer IL1. The substrate region PPW can be of slightly doped P-conductivity type. The pixel structure PXL can be part of a sensor comprising pixels arranged in rows and in columns, the rows of pixels and the columns of pixels being isolated from each other by deep isolating trenches DTI formed in the substrate from the front or rear face of the latter. The pixel PXL comprises two slightly doped N-conductivity type wells PNW1, PNW2, implanted deep in the substrate region PPW to form with the latter the photodiodes PD1, PD2. The wells PNW1, PNW2 extend deep into the substrate region PPW, over most of the depth of the trenches DTI beneath the layer IL1 (between 75 and 95% of the depth of the trenches) and over most of the width (between 85 and 95% of the distance) between two trenches DTI. The wells PNW1, PNW2 are relatively narrow, having a width lower than or in the vicinity of one third of the distance between two trenches DTI. Thus, the N-conductivity type wells PNW1, PNW2 are crimped between two P-conductivity type regions, thus forming narrow and deep parallelepipedal regions. The wells PNW1, PNW2 can have a width-to-length ratio of ⅓.

Above an area between the wells PNW1, PNW2, the pixel structure PXL comprises a substrate bias region BBP, a read region SNN, a gate stack RSG and a conduction region RSN of the reset transistor T3 (FIGS. 5, 6A, 6B, 6C, 6F).

The substrate bias region BBP and the read region SNN are each formed by a semi-conductive layer filling a hole passing through the layers IL1, IL2 and reaching in the substrate region PPW a depth substantially corresponding to that of the high parts of the wells PNW1, PNW2. The substrate bias region BBP has a heavily doped P-conductivity type and is linked to a substrate bias contact BB above the layer IL2. The read region SNN has an N-conductivity type which can be heavily doped in its top part SNN1 (front face of the substrate) and less doped in its lower part SNN2. The region SNN1 is linked above the layer IL2 to the read node contact SN. The gate stack RSG is formed above a P-conductivity type semi-conductive channel region RSP, formed in the layer IL2. The gate stack RSG is linked above the layer IL2 to a contact receiving the control voltage RST. The heavily doped N-conductivity type conduction region RSN is also formed in the layer IL2. The region RSN is linked above the layer IL2 to a contact receiving the voltage RSV. The conduction regions SNN, BBP through the layers IL1, IL2 and the conduction regions RSP, RSN in the layer IL2 can be formed by epitaxy of a semi-conductive material such as silicon.

Figure 5:
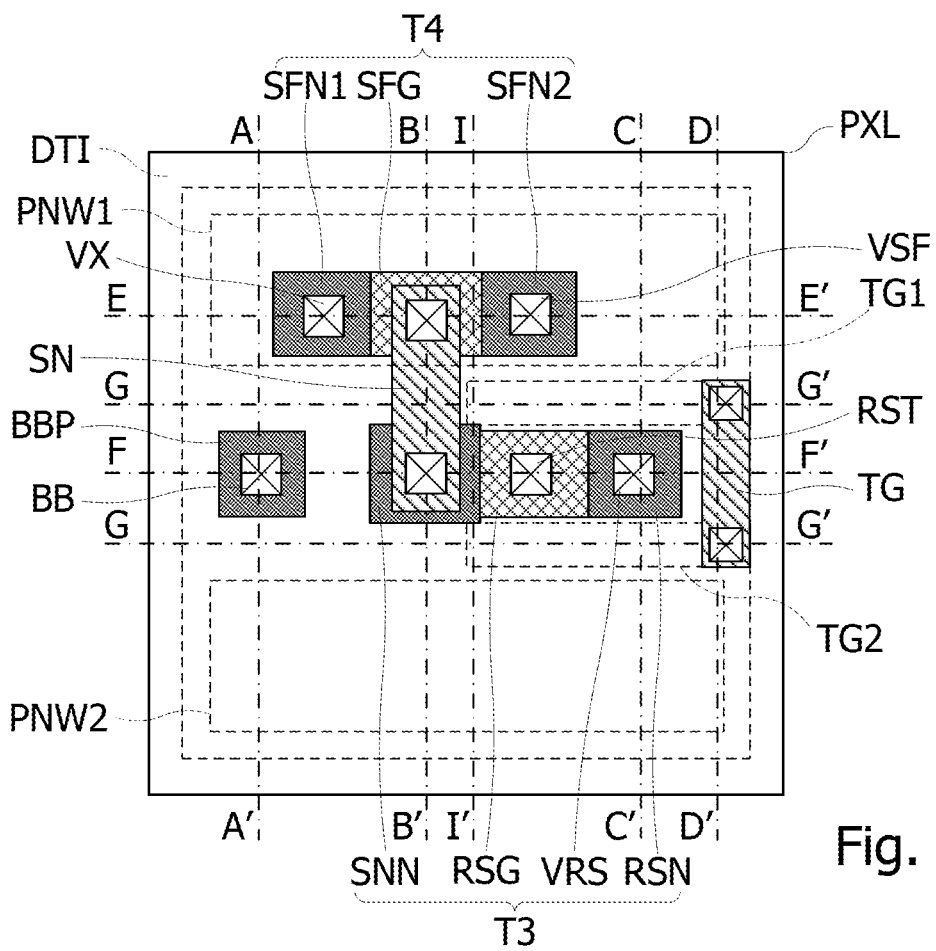
FIG. 5 is a top view of a pixel forming the electric circuit in FIG. 4, of one embodiment.

In particular on FIGS. 5, 6B and 6E, the transistor T4 is formed in the isolating layer IL2, above one of the wells PNW1, PNW2, for example the well PNW1. The transistor T4 comprises two N-conductivity type conduction regions SFN1, SFN2, separated by a P-conductivity type channel region SFP. A gate stack SFG is formed above the region SFP. The region SFN1 is linked above the layer IL2 to a contact subjected to a voltage VX. The region SFN2 is linked above the layer IL2 to a contact subjected to the voltage VSF. On FIGS. 5 and 6B, the region SNN1 and the gate stack SFG are linked to the contact SN.

In particular on FIGS. 5, 6C, 6D, and 6G, the pixel structure PXL also comprises deep vertical gates TG1, TG2 of the transfer transistors T1, T2, formed between the wells PNW1, PNW2. The read region SNN is between parts of the gates TG1, TG2 located in the vicinity of the center of the pixel structure PXL. Each gate TG1, TG2 is formed in a deep trench the lateral walls and the bottom of which are covered with a thin layer of isolating material TGI1, TGI2, and which is filled with a conductive material such as polycrystalline silicon, up to a level lower than the isolating layer IL1. The top part (front face of the substrate) of the trench forming each of the gates TG1, TG2 is filled with an isolating material. Each gate TG1, TG2 comprises a column TGC1, TGC2 establishing an electric link between the conductive material forming the gates TG1, TG2 and the surface of the layer IL2 along one of the isolating trenches DTI. The columns TGC1, TGC2 of the gates TG1, TG2 can be linked to each other above the layer IL2 by a conductive link TG. It shall be noted that the columns TGC1, TGC2 are not necessarily formed along a trench DTI, but can be formed in another location above the trenches in which the gates TG1, TG2 are formed.

Figure 6G:
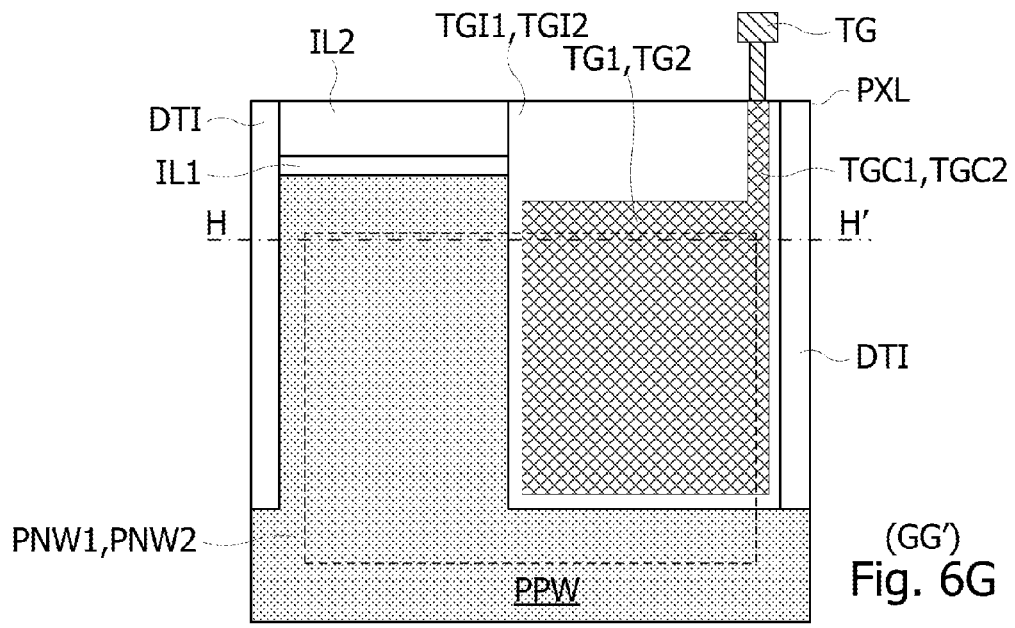

On FIG. 6G, each gate TG1, TG2 extends and is opposite substantially the entire height and the right or left half of the lateral face of one of the wells PNW1, PNW2, the wells PNW1, PNW2 themselves extending over most (between 85 and 95%) of the distance between two trenches DTI and over most (between 75 and 95%) of the depth of the trenches DTI beneath the layer IL1.

Figure 7:
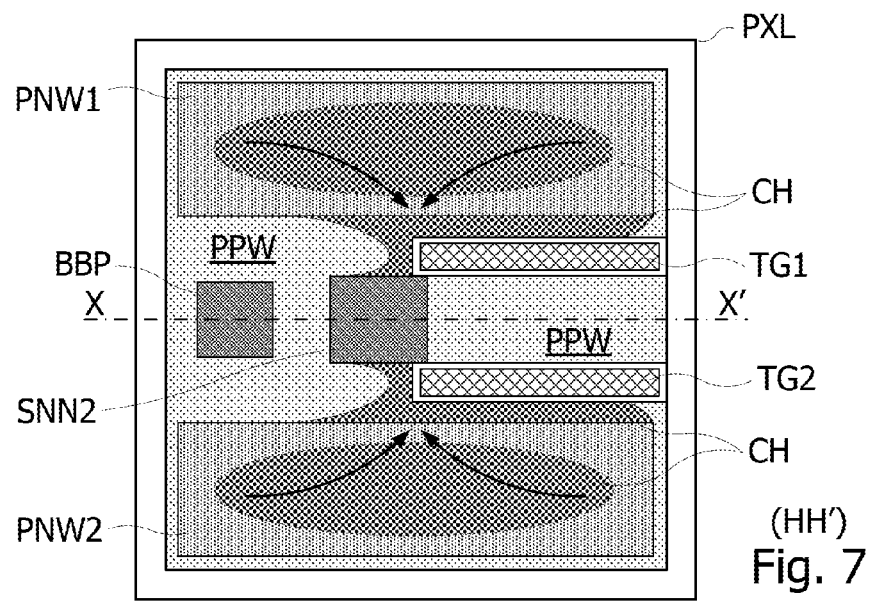
FIG. 7 is a cross-section of the pixel of a plane HH' parallel to the surface of the substrate, indicated on FIGS. 6A and 6G, FIGS. 8A, 8B, 8C, 8D, 8E and, 8F are cross-sections of a substrate, of a plane II' indicated on FIG. 5, showing steps of manufacturing the pixel in FIG. 5, FIGS. 8G and 8H are cross-sections of the substrate in FIGS. 8A to 8F, of the plane GG' indicated on FIG. 5, showing steps of manufacturing the pixel in FIG. 5.

In the example in FIG. 7, the photodiode region formed in the substrate region PPW has a symmetrical structure comprising two wells PNW1, PNW2 and two gates TG1, TG2, spread over each side of a symmetry plane XX', as well as a bias region BBP and a read region SNN passed through by the symmetry plane XX'. Each of the gates TG1, TG2 forms in the substrate region PPW a channel region extending between the gate and the opposite well PNW1, PNW2, and between the well and the region SNN1, SNN2. Thus, the gates TG1, TG2 are capable of efficiently draining the charges CH accumulated in the wells PNW1, PNW2, both deep down and on the surface of the wells, to send them to the read region SNN.

Thus, the substrate region PPW delimited on three sides by three adjacent trenches DTI and on one side by one of the gates GT1, GT2, forms a photodiode region or an electric charge collecting region.

As an example, the isolating trenches DTI and the gates TG1, TG2 can extend over a depth of 1.5 to 3.5 μm, and have a width of 0.1 to 0.3 μm, for example 0.15 μm. The isolating layer TGI1, TGI2 in the trenches forming the gates TG1, TG2 can have a thickness of 10 to 20 nm. The width of a pixel (distance between two consecutive parallel trenches DTI) may be lower than 2 μm, for example reduced to 1.1 μm.

Figure 1:
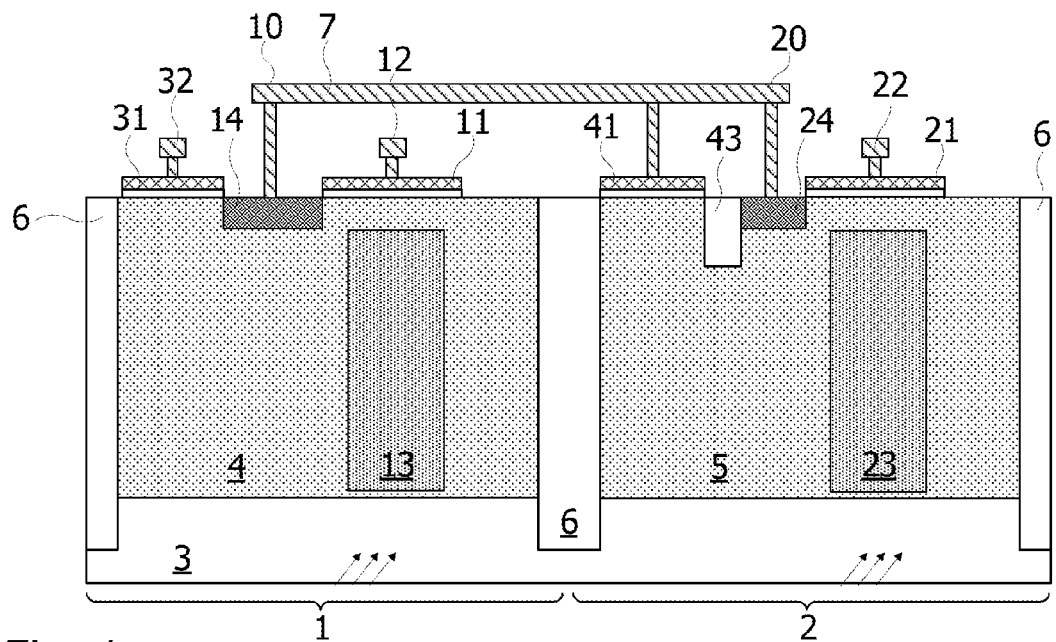
FIG. 1 described above is a cross-section of a pair of pixels, of prior art.
Figure 2:
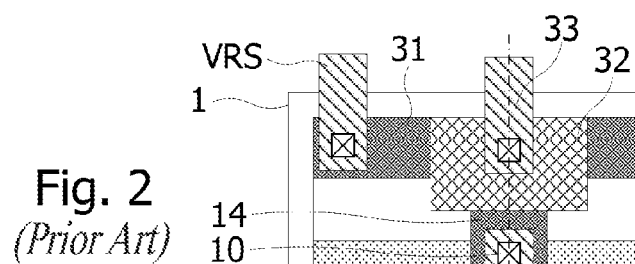
FIG. 2 described above is a top view of the pair of pixels in FIG. 1.
Figure 3:
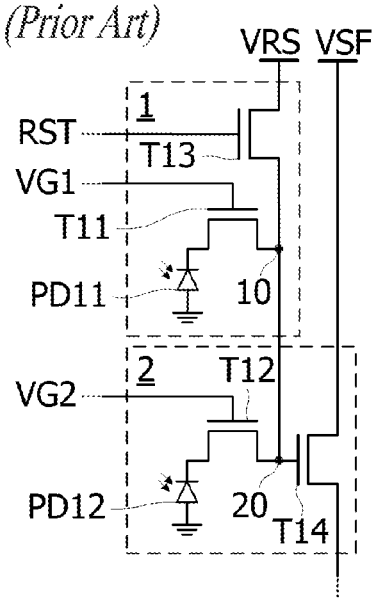
FIG. 3 described above schematically represents an electric circuit formed by the pair of pixels in FIG. 1, FIG. 4 schematically represents an electric circuit of a pixel, of one embodiment.

The pixel structure that has just been described enables two photodiodes of the size of the one represented on FIGS. 1 and 2, and two transfer gates to be formed in a single pixel, without increasing the surface area occupied by the pixel, while increasing the channel surface area of the transfer transistors. Furthermore, the transfer gates TG1, TG2 substantially extend over the entire height of the wells PNW1, PNW2, which enables the electric charges accumulated in the wells to be efficiently brought up to the gate contact TG on the front face of the substrate.

FIGS. 8A to 8H represent an SOI-type substrate at different steps of manufacturing the pixel PXL. On FIG. 8A, the substrate comprises the semiconductor substrate region PPW, for example made of silicon, comprising a front face on which are deposited a layer IL1 made of an isolating material such as silicon oxide, and on the layer IL1, a layer SL made of a semi-conductive material, for example silicon formed by epitaxy.

Figure 8A:
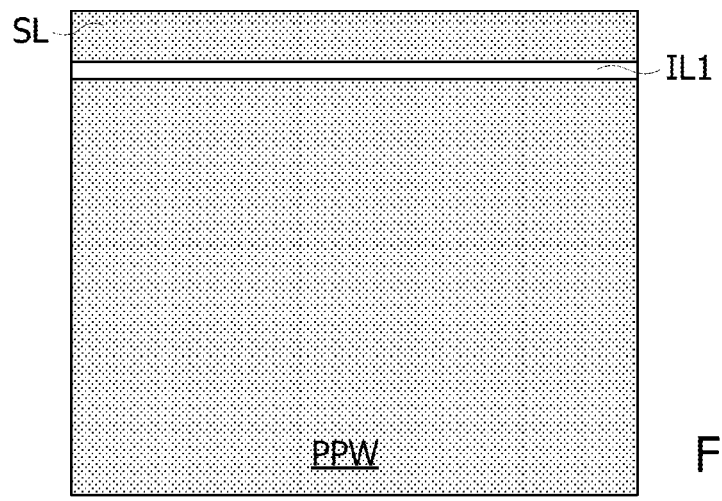
Figure 8B:
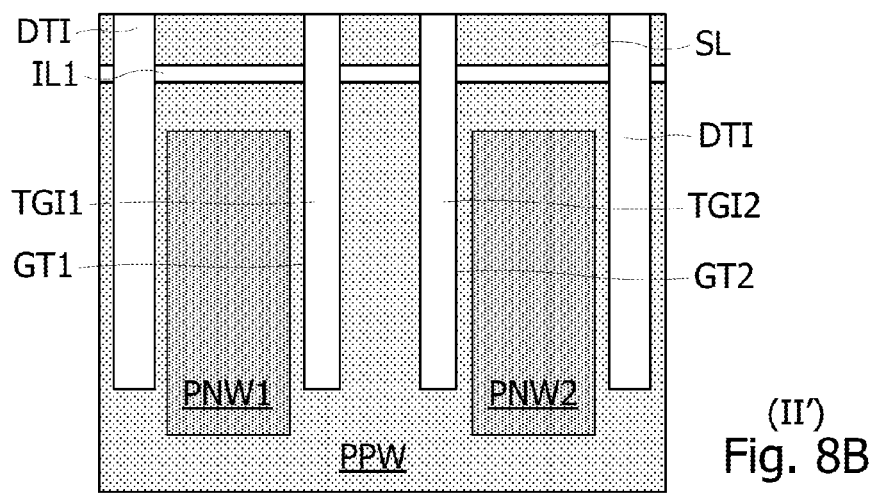

FIG. 8B shows steps of forming deep trenches and of filling these trenches with an isolating material such as silicon oxide, to form the isolating trenches DTI and the trenches GT1, GT2 containing the isolating material of the vertical gates TGI1, TGI2. FIG. 8B also shows a step of forming the wells PNW1, PNW2 between the trenches DTI and the gate trenches, by implanting dopants deep in the substrate region PPW.

Figure 8C:
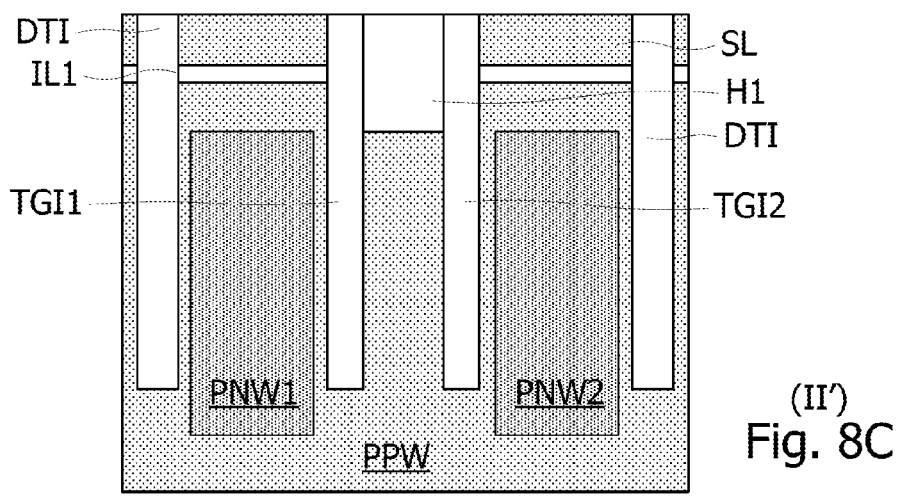

FIG. 8C shows a step of forming a hole H1 between the trenches GT1, GT2 filled with isolating material. The hole H1 is produced through the layers SL and IL1, sufficiently deep to reach the substrate region PPW, for example at a level corresponding to the level of the top part (front face of the substrate) of the wells PNW1, PNW2 in the substrate region PPW. During this step, another hole of the same depth as the hole H1 can be formed for the substrate bias region BBP.

Figure 8D:
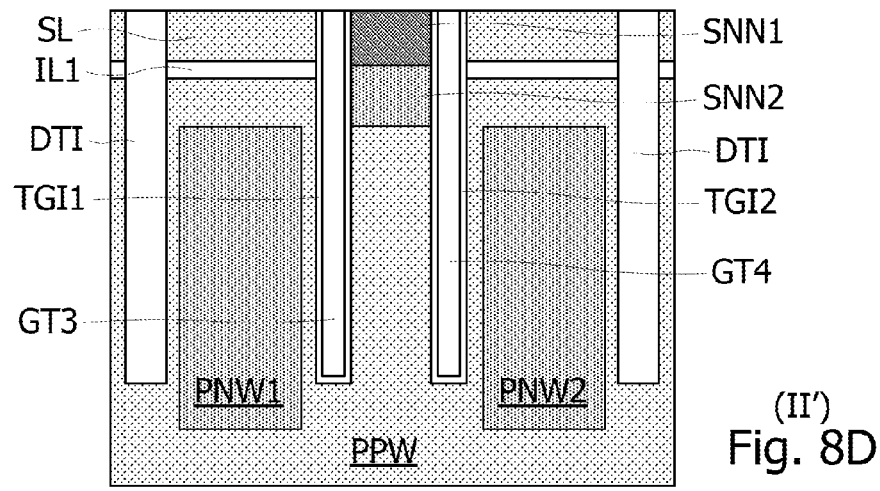

FIG. 8D shows steps of forming the conduction region SNN of the read node SN, by filling the hole H1 with a semi-conductive material, for example silicon deposited by epitaxy. To form the substrate bias region BBP, the hole can also be filled in the same way when filling the hole H1. The region SNN is then formed by implanting dopants in the material filling the hole H1, so as to form the area SNN1 on the surface, more heavily doped than the area SNN2 deep down. The substrate bias region BBP is also formed by implanting appropriate dopants in the material filling the hole.

FIG. 8D also shows a step of forming trenches GT3, GT4 in the isolating material TGI1, TGI2 filling the trenches GT1, GT2. The trenches GT3, GT4 are formed so as to leave a thin isolating layer GTI1, GTI2 on the walls and the bottom of the trenches GT1, GT2.

Figure 8E:
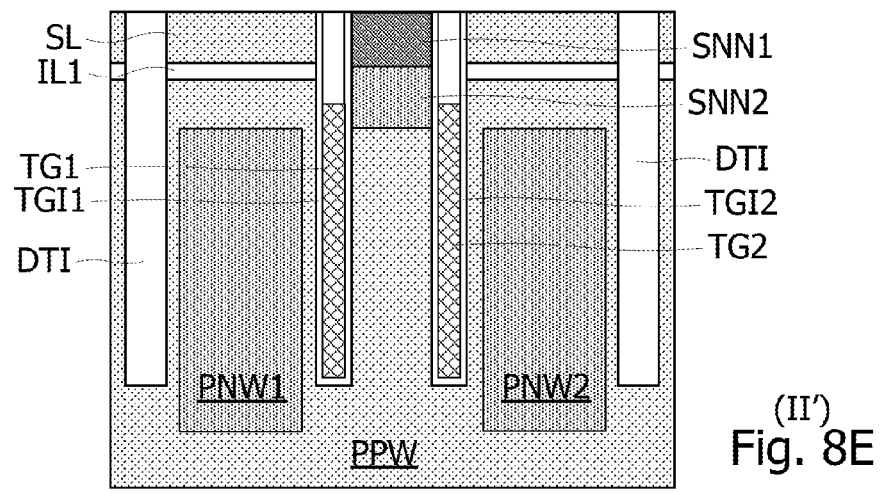
Figure 8F:
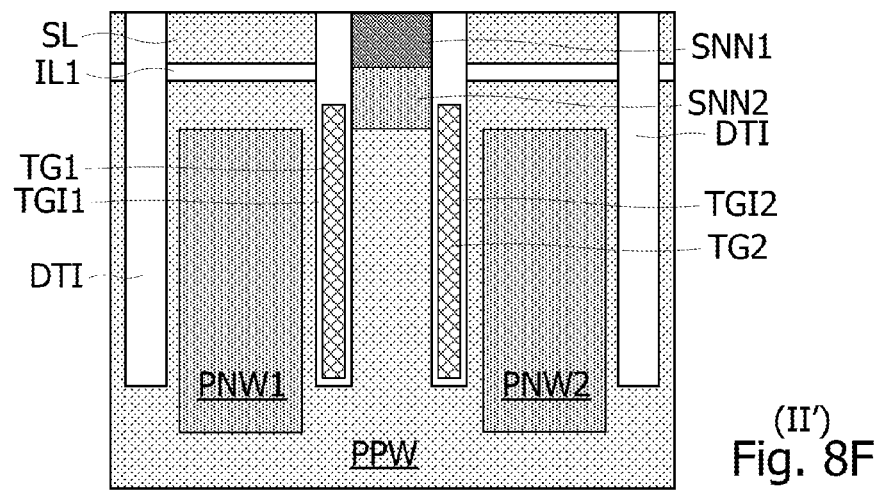

FIG. 8E shows a step of partially filling the trenches GT3, GT4 formed in the isolating material TGI1, TGI2 with a conductive material such as polycrystalline silicon. Thus, the trenches GT3, GT4 are filled up to a level lower than the isolating layer IL1. FIG. 8F shows a step of filling the trenches GT3, GT4 with an isolating material TGI3, such as silicon oxide, up to the front face of the external layer SL.

Figure 8G:
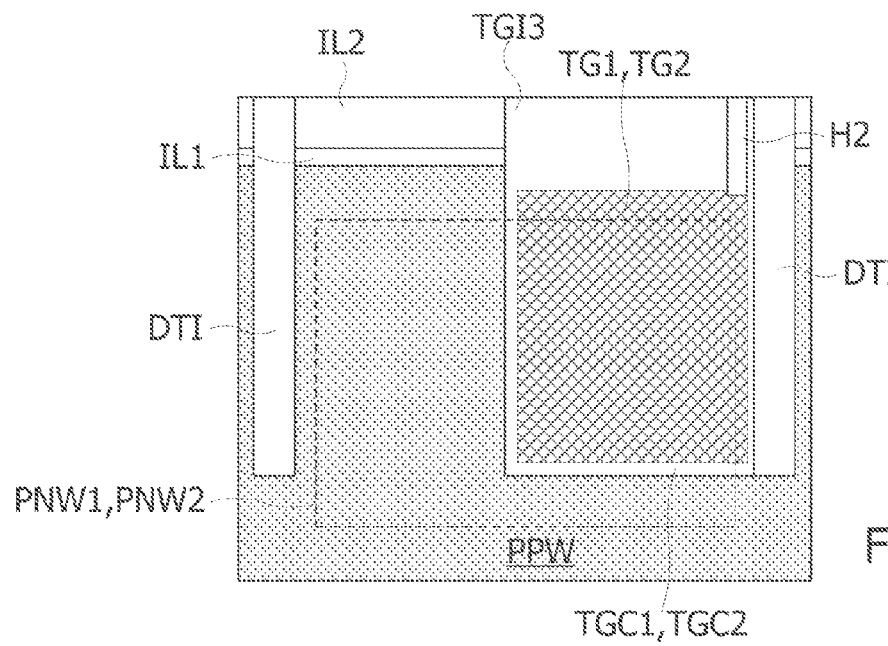
Figure 8H:
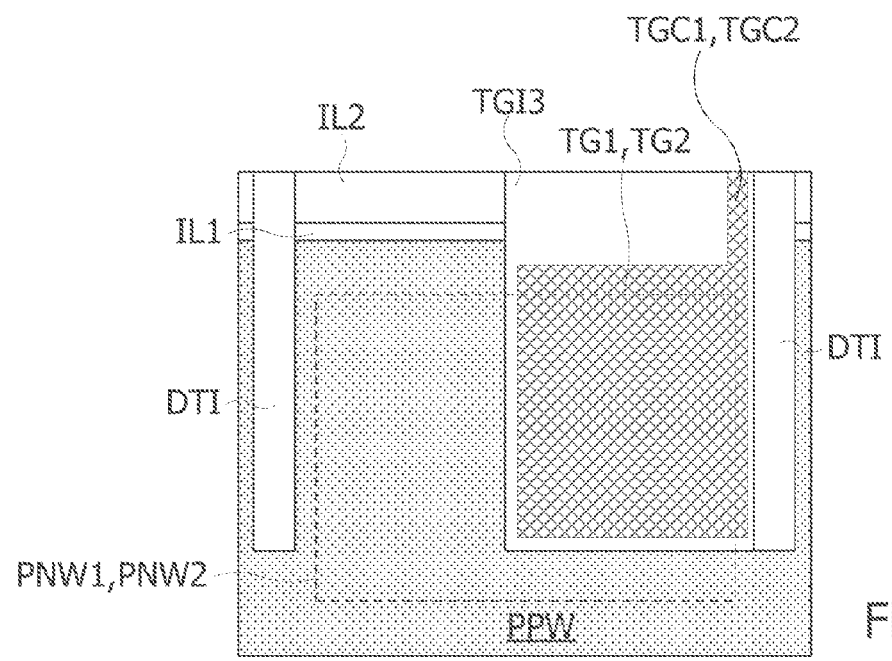

FIG. 8G shows a step of forming holes H2 in the isolating layers TGI3 filling the top part (front face of the substrate) of the gate trenches GT1, GT2, along the trenches DTI. FIG. 8H shows a step of filling the holes H2 with the conductive material forming the gates GT1, GT2, so as to form the columns TGC1, TGC2.

It shall be noted that the columns TGC1, TGC2 can be formed by filling the trenches GT3, GT4 with conductive material up to the front face of the layer SL, by etching the conductive material in the trenches GT3, GT4 up to a level lower than the isolating layer IL1, by leaving the columns TGC1, TGC2, and by filling the holes thus formed with an isolating material TGI3.

Figure 9:
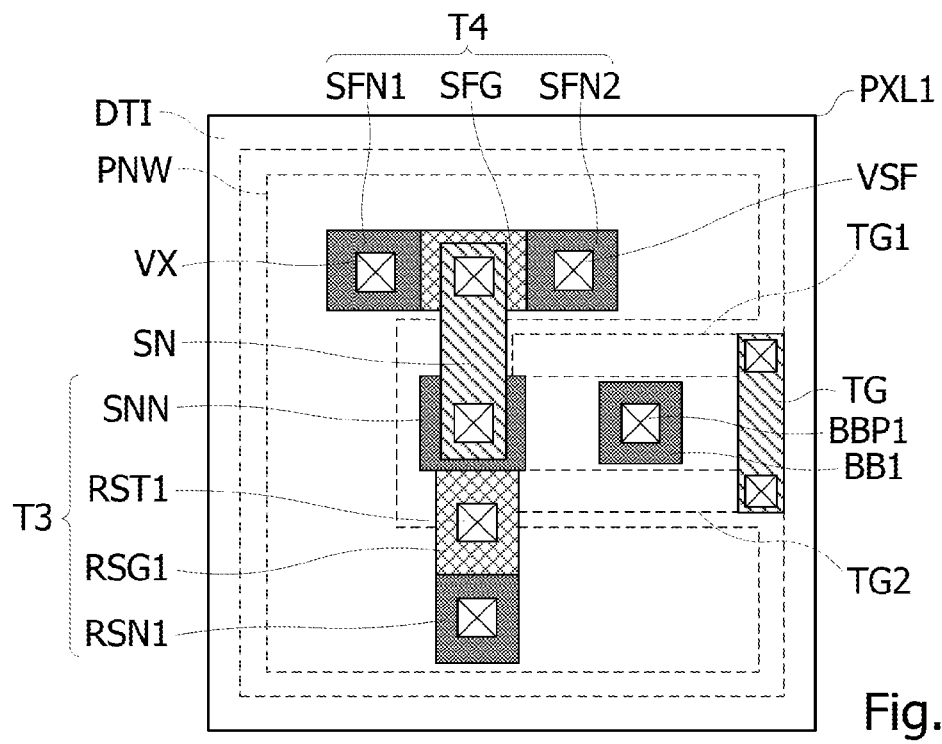
FIG. 9 is a top view of a pixel, of another embodiment.
Figure 10:
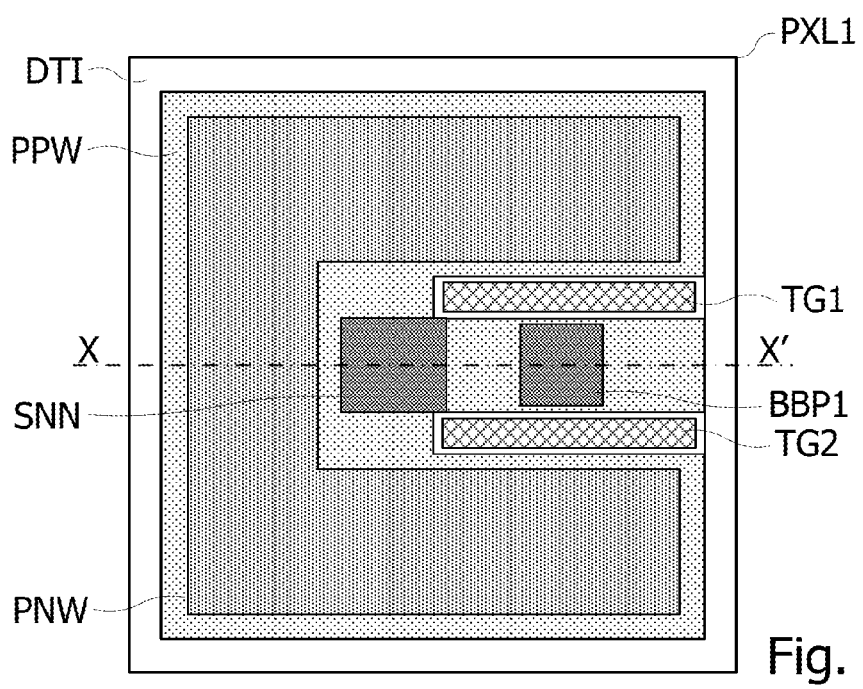
FIG. 10 is a cross-section of the pixel in FIG. 9, of a plane parallel to the surface of the substrate.

FIGS. 9 and 10 represent a pixel structure PXL1 of another embodiment. FIGS. 9 and 10 correspond to views similar to the views of FIGS. 5 and 7. The pixel structure PXL1 differs from the pixel structure PXL in that the wells PNW1, PNW2 are linked to each other by the parts of their faces opposite the side not covered with a gate GT1, GT2, so as to form a single well PNW. Thus, the well PNW has a U-shaped section in a plane parallel to the front face of the substrate region PPW. The well PNW extends along three sides of the pixel PXL1 delimited by a first pair of parallel trenches DTI and a second pair of trenches perpendicular to the trenches of the first pair. Inside the U shape of the well PNW, the read region SNN, and the gates GT1, GT2 are formed, and between the gates, a substrate bias region BBP1 is formed. Like the pixel structure PXL, the regions SNN and BBP1 reach the substrate region PPW beneath the isolating layer IL1. The reset transistor T3 is thus rotated by 90° around the region SNN, in relation to the pixel structure PXL. Thus, the transistor T3 comprises a conduction region formed by the region SNN of the transistor T3, a conduction region RSN1 formed above the well PNW, and a gate stack RSG1 above a channel region formed between the regions SNN and RSN1.

Figure 11:
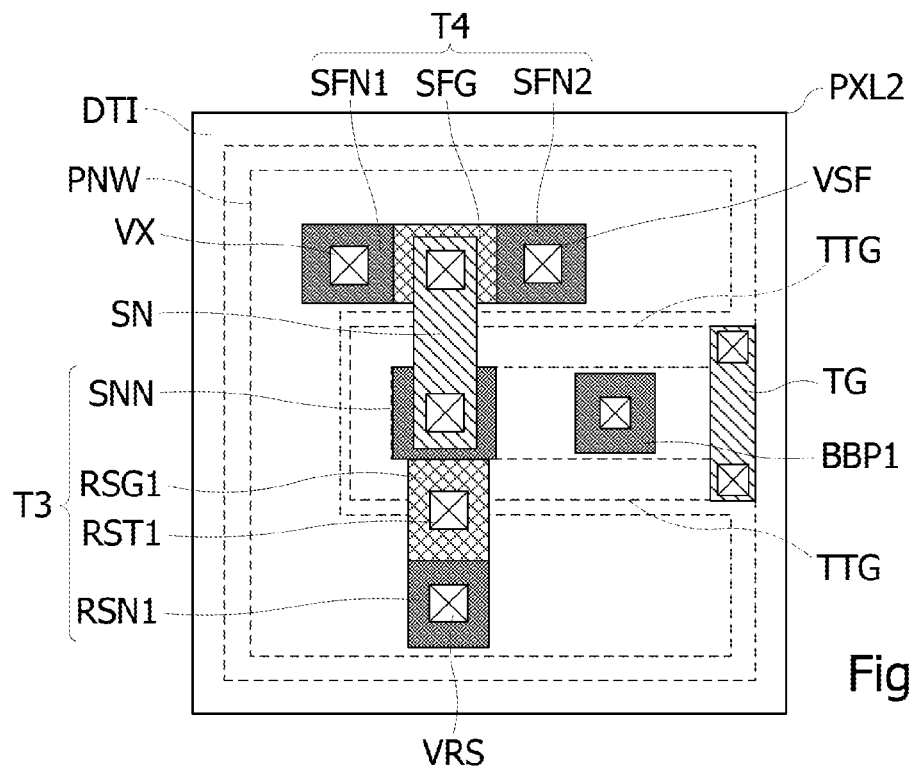
FIG. 11 is a top view of a pixel, of another embodiment.
Figure 12:
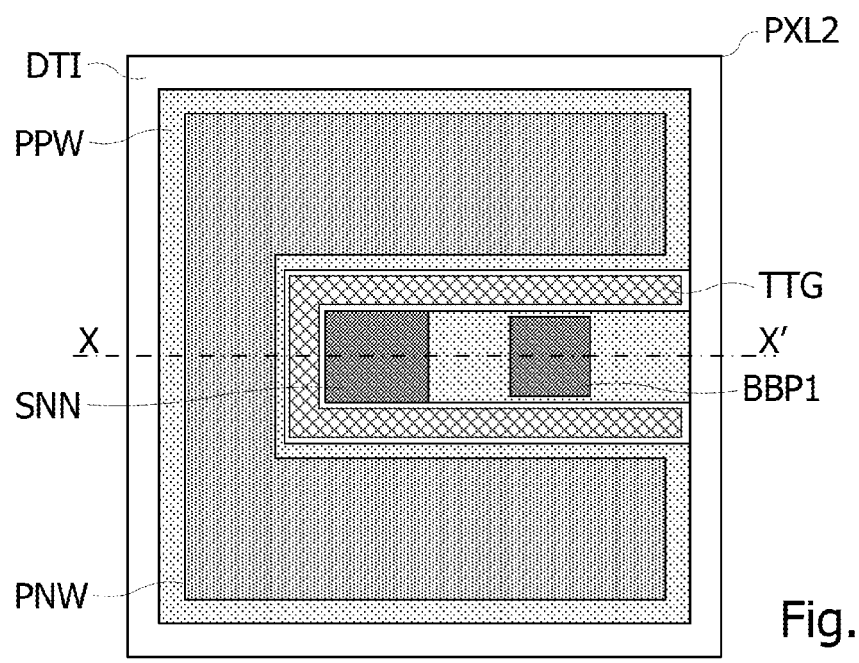
FIG. 12 is a cross-section of the pixel in FIG. 11, of a plane parallel to the surface of the substrate.

FIGS. 11 and 12 represent a pixel structure PXL2 of another embodiment. FIGS. 11 and 12 correspond to views similar to the views of FIGS. 5 and 7. The pixel structure PXL2 differs from the pixel structure PXL1 in that the two embedded vertical gates TG1, TG2 are linked to each other by a vertical gate portion bypassing the read region SNN, so as to form a single gate TTG having a U-shaped section in a plane parallel to the front face of the substrate PPW. A single or both columns TGC1, TGC2 can link the gate TTG to the front face of the layer IL2.

In the example in FIGS. 10 and 12, the photodiode region formed in the substrate region PPW also has a symmetrical structure in relation to the plane XX'.

Figure 13:
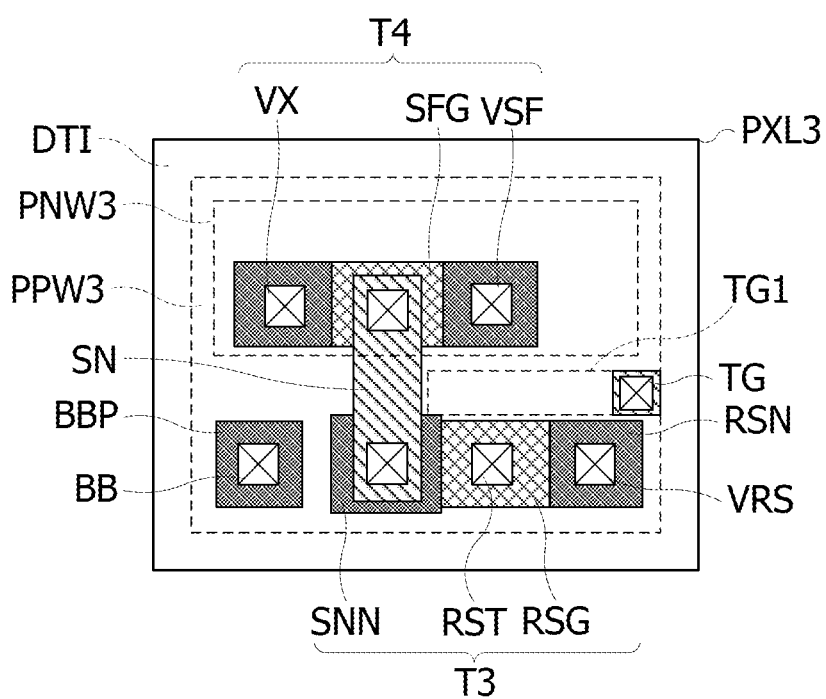
FIG. 13 is a top view of a pixel, of another embodiment.

It will be understood by those skilled in the art that the present disclosure is susceptible of various alternative embodiments and various applications. In particular, the disclosure is not limited to a pixel structure with two photodiodes or a single photodiode comprising a U-shaped electric charge collecting region. To obtain a more compact pixel structure, provision may be made to form only one parallelepipedal well in a pixel. Thus, FIG. 13 represents a pixel structure which differs from the pixel structure represented in FIG. 5 in that it comprises a single well PNW3, and a single deep vertical transfer gate TG1. The well PNW3 extends deep in a substrate region PPW3, and over most of the thickness (between 75 and 95%) and the width (between 85 and 95%) of the latter between two trenches DTI. The well PNW3 has a width lower than or in the vicinity of half the distance between two trenches DTI. Furthermore, the reset transistor T3 and the source follower transistor T4 are not necessarily formed in the pixel structure, but can be formed outside the substrate region isolated by the trenches DTI, in which the pixel is formed.

Furthermore, the photodiode structure associated with a deep vertical transfer gate as described above, may be used alone in many applications implementing one or several photodiodes. In this case, the transistors T3 and T4 can also be formed elsewhere than above the electric charge collecting region of the photodiode.

It shall also be noted that the pixel structures previously described can be produced in a conventional semiconductor substrate rather than in an SOI-type substrate. In this case, the reset transistors T3 and source follower transistors T4 are formed so as to be isolated by an isolating layer from the substrate part in which the photodiode is formed.

It will be understood by those skilled in the art that the features of the various embodiments described above can be combined in various ways.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate;
a first electric charge collecting region and a second electric charge collecting region in the substrate, each configured to collect electric charges when the substrate receives light, the first and second collecting regions each including a first doped region formed in the substrate;
a second doped region, formed in the substrate and positioned between the first and second collecting region;
a deep isolating trench positioned between the first doped regions of the first and second collecting regions; and
a first isolated transfer gate and a second isolated transfer gate, disposed in the substrate between the first and second collecting regions and next to the second doped region, and the first and second transfer gates being configured to receive a gate voltage to transfer electric charges stored in the first and second collecting regions, respectively toward the second doped region, the first and second transfer gates being formed in the deep isolating trench.

2. The device of claim 1, further comprising first and second conductive columns coupled to the first and second transfer gates, respectively, the substrate including an isolating layer on the first surface of the substrate, the first and second conductive columns extending through the isolating layer to a front face of the substrate.

3. The device of claim 1 wherein each transfer gate has a lateral surface corresponding to and disposed opposite a right or left half of a lateral face of one of the first doped regions.

4. The device of claim 1 wherein the first and second collecting regions have a symmetrical structure including the first doped regions and the first and second transfer gates each disposed between one of the first doped regions and the second doped region, to transfer electric charges stored in the collecting regions toward the second doped region.

5. A device, comprising:
a substrate;
a U-shaped electric charge collecting region configured to collect electric charges when the substrate receives light, the collecting region including a U-shaped first doped region formed in the substrate in a plane parallel to a first surface of the substrate;
a second doped region, formed in the substrate and positioned between branches of the U-shaped collecting region;
a deep isolating trench positioned between the branches of the collecting region; and
an isolated transfer gate disposed in the substrate between the branches of the collecting region and next to the second doped region, and configured to receive a gate voltage to transfer electric charges stored in the collecting regions toward the second doped region, the transfer gate being formed in the deep isolating trench.

6. The device of claim 5 wherein the collecting region has a symmetrical structure and the transfer gate has a symmetrical structure.

7. The device of claim 5 wherein the collecting region is spaced from the first surface of the substrate and spaced from a second surface of the substrate to be positioned within the substrate.

8. The device of claim 5 wherein the transfer gate is positioned between the branches of the U-shape of the first doped region and is positioned around the second doped region.

9. An image sensor, comprising:
a substrate;
a plurality of pixels formed in the substrate, each pixel including a first photodiode and a second photodiode, the first and second photodiodes including:
a first electric charge collecting region and a second electric charge collecting region, each configured to collect electric charges the substrate receives light, the first and second collecting regions each including a first doped region formed in the substrate;
a second doped region, formed in the substrate and positioned between the first and second collecting region;
a deep isolating trench positioned between the N-conductivity type regions of the first and second collecting regions; and
a first isolated transfer gate and a second isolated transfer gate, disposed in the substrate between the first and second collecting regions and next to the second doped region, and the first and second transfer gates being configured to receive a gate voltage to transfer electric charges stored in the first and second collecting regions, respectively toward the second doped region, the first and second transfer gates being formed in the deep isolating trench.

10. The sensor of claim 9 wherein the second doped region forms a conduction region of a reset transistor configured to set a voltage of the second doped region.

11. The sensor of claim 9 wherein each pixel includes a source follower transistor having a gate terminal coupled to the second doped region, the source follower transistor being formed above the first doped region, an isolating layer being arranged between the source follower transistor and the first doped region.

12. The sensor of claim 9 wherein the pixels are isolated from each other by the deep isolating trenches or embedded vertical gates.

13. A method, comprising:
manufacturing an image sensor having a plurality of pixels, the manufacturing including:
forming in a P-conductivity type substrate region a first and second electric charge collecting region for collecting electric charges that appear when a surface of the substrate region receives light;
forming the first and second collecting regions to each have a first doped region in the substrate region;
forming in the substrate region a second doped region;
forming in the substrate region a deep isolating trench extending between the first and second collecting regions and next to the second doped region; and
forming an isolated transfer gate in the isolating trench, the transfer gate being configured for receiving a gate voltage to transfer electric charges stored in the collecting region toward the second doped region.

14. The method of claim 13 wherein the substrate is of silicon-on-insulator type.

15. The method of claim 13, further comprising forming the second doped region and a substrate bias region by epitaxy of a semi-conductive material in a hole passing through an isolating layer of the substrate to reach the substrate region.

* * * * *